United States Patent [19]
Elliott

[11] Patent Number: 5,644,101
[45] Date of Patent: Jul. 1, 1997

[54] PRINTED CIRCUIT BOARD SHIELD ASSEMBLY

[75] Inventor: Charles Anthony Elliott, Greenwood, Ind.

[73] Assignee: Thomson Consumer Electronics, Inc., Indianapolis, Ind.

[21] Appl. No.: 196,248

[22] PCT Filed: Jul. 30, 1993

[86] PCT No.: PCT/US93/07207

§ 371 Date: Feb. 24, 1994

§ 102(e) Date: Feb. 24, 1994

[87] PCT Pub. No.: WO94/06268

PCT Pub. Date: Mar. 17, 1994

Related U.S. Application Data

[63] Continuation of Ser. No. 936,770, Aug. 28, 1992, abandoned.

[51] Int. Cl.[6] .................................................. H05K 9/00
[52] U.S. Cl. .......................... 174/35 R; 361/818
[58] Field of Search .................. 174/35 R, 35 GC, 174/35 C; 361/717, 718, 719, 720, 748, 800, 816, 818; 334/85

[56] References Cited

U.S. PATENT DOCUMENTS

| | | | |
|---|---|---|---|
| 3,365,621 | 1/1968 | Von Fange et al. | 334/85 |
| 3,596,216 | 7/1971 | Walsh | 334/7 |
| 4,494,095 | 1/1985 | Noji et al. | 334/85 |
| 4,635,098 | 1/1987 | Thong | 358/14 |
| 4,996,630 | 2/1991 | Liguori et al. | 361/816 X |
| 5,014,160 | 5/1991 | McLoy, Jr. | 174/35 R |
| 5,175,395 | 12/1992 | Moore | 174/35 R |
| 5,353,201 | 10/1994 | Maeda | 361/816 |
| 5,377,081 | 12/1994 | Bizen et al. | 361/818 |
| 5,379,008 | 1/1995 | Bockelman et al. | 333/174 |
| 5,398,169 | 3/1995 | Gorenz, Jr. et al. | 361/818 |
| 5,414,597 | 5/1995 | Lindland et al. | 361/816 |
| 5,434,747 | 7/1995 | Shibata | 361/753 |

FOREIGN PATENT DOCUMENTS

| | | |
|---|---|---|
| 0169329 | 1/1986 | European Pat. Off. . |
| 2029645 | 3/1980 | United Kingdom . |
| 2045539 | 10/1980 | United Kingdom . |
| 2156162 | 10/1985 | United Kingdom . |

*Primary Examiner*—Bot L. Ledynh
*Attorney, Agent, or Firm*—Joseph S. Tripoli; Frederick A. Wein; Peter M. Emanuel

[57] ABSTRACT

A shield assembly for installation on a portion of a printed circuit board is presented. The shield (16) assembly includes shield mounted on the component mounting side of the printed circuit board and has a plurality of support projections (30) inserted through apertures of the printed circuit board to the conductor side where they are mechanically secured and electrically connected to a reference potential. A first shield cover (22) is mounted to the shield at a peripheral edge distal of the printed circuit board. A second shield cover (34) is disposed at the conductor side of the printed circuit board. The second shield cover (34) is provided with two pluralities of protrusions (32, 42). The first plurality of protrusions (32) extends through apertures in the printed circuit board to engage the body of the shield. The second plurality of protrusions (42) engages respective support projections (30) of the shield.

7 Claims, 2 Drawing Sheets

PRINTED CIRCUIT BOARD SHIELD ASSEMBLY

This is a continuation of application Ser. No. 07/936,770 filed Aug. 28, 1992, now abandoned.

BACKGROUND OF THE INVENTION

This invention relates to electromagnetic shields, and particularly, to radio frequency (RF) shields mounted on printed circuit boards.

It is often desirable to shield an area of printed circuit boards, or a volume associated therewith, with shielding members so that electromagnetic energy, e.g., radiated RF signals, are contained within the shielded volume or area, or excluded from the shielded volume or area. Such shielding is extensively used in television receivers, direct satellite broadcast receivers, radio receivers such as FM and shortwave, or portions of audio systems wherein low signal level circuitry is amenable to being effected by stray electromagnetic fields, e.g, 50–60 cycle fields emanating from AC power sources. Examples of circuits utilizing such shielding include RF tuner circuits which amplify low level signals received by an antenna, or low signal level audio circuits in the input stage of an audio system. Additionally, if a circuit generates a signal which can radiate either to other circuits of the same device or external of the device, the electromagnetic shielding will contain the radiation. Such a circuit can be an RF tuner local oscillator and/or a mixer.

The term "printed circuit board" as used herein refers to circuit boards having electrical conductors disposed on one or more sides of a dielectric board by deposition, etching or any other applicable process such as laminating (used for producing multi-layered boards). Modern television circuit board assemblies are generally manufactured by mounting components on the component side of the printed circuit board with their leads extending through apertures in the board to conductor pads of conductive pathways disposed on the conductor side of the board. The leads are typically soldered to the conductor pads. It should be noted that it is not uncommon for printed circuit boards to have components also mounted on the conductor side, or to have conductors on both sides of the board. RF shields typically have a shield member mounted on the component side by the extension of tabs or protrusions from the shield through apertures formed in the board to the conductor side. These tabs most commonly are soldered to a conductor pad proximal to or surrounding the aperture.

To lower production costs, it is desirable to have as many components and circuits as possible placed on a single printed circuit board to eliminate multiple handling of printed circuit boards, and to eliminate interconnection wiring between printed circuit boards. Towards this end, tuners are now being placed on the main printed circuit board of a television receiver. This is a change from tuners having their own printed circuit boards and located close to the input of their signals, e.g. antenna, or close to the tuning controls, such as channel selection switches. For the stand alone tuners, the boards were encased in their own shielding boxes which totally surrounded the printed circuit boards except for wiring terminals for interconnection of the printed circuit boards to other circuitry. It should be noted that both the components and the wiring between components, which are disposed within the shielded volume, are shielded from electromagnetic interference caused by extraneous signals or fields. With the location of the tuner on the main printed circuit board, the interconnection of the tuner with other circuitry is accomplished with the printed circuit wiring extending through the shielding to the outside of the shielded volume. However, in such a case, the degree of shielding of the tuner is reduced because both of the need to pass these printed circuit conductors through the shield, and the need to maintain sufficient structural integrity of the printed circuit board so that the shielded tuner portion of the board will be sufficiently supported.

The effectiveness of the shield assembly is greatly impaired if there are any "gaps" in the shielding. Such gaps, or unshielded areas, can permit substantial field leakage to or from the shielded volume. Although the shield itself completely encompass or circumpose an area on the printed circuit board, shield covers are necessary to shield the enclosed area of the printed circuit board in a direction normal to the board. In order to facilitate repairs, these shield covers are detachable from the shield. Even when the covers are in place, some leakage gaps along the locus of engagement between the shield and the shield cover occurs. The shield cover on the shield mounting side of the board (component side) usually has bent edges so that when that shield cover is mounted onto the shield, the upper edges of the shield are fully enclosed by the cover. This bent-over edge of the cover is often provided with spring-loaded protrusions to secure the cover to the shield while permitting removal.

However, enclosing the volume from the other side of the printed circuit board (the conductor side) is a more difficult matter. Elongated apertures or slots can be provided in the printed circuit board in order to facilitate mounting of a conductor side cover to the shield. This can be accomplished by the bottom shield having elongated protrusions extending through the printed circuit board slots to mechanically and electrically engage the sides of the shield in a manner similar to the top shield cover. However, this arrangement is not entirely satisfactory since it leaves unnecessary gaps in the shield assembly. Accordingly, it is desirable to provide a printed circuit board shielding arrangement which minimizes the leakage gaps.

SUMMARY OF THE INVENTION

Briefly, the present invention is a shield assembly, for a tuner or the like, installed on a portion of a printed circuit board. The shield assembly provides improved electromagnetic shielding while maintaining the structural integrity of the printed circuit board and allowing normal manufacturing processes be used. A shield is mounted onto the component mounting side of the printed circuit board and has a plurality of support protrusions inserted through apertures of the printed circuit board to the conductor side where they are mechanically secured to a conductive pathway, preferably by solder applied in a wave-soldering process, and electrically connected to a reference potential. A first shield cover is mounted on the shield distal of the component side of the printed circuit board and electrically and mechanically engages the shield along the locus of engagement. A second shield cover is disposed proximal the conductive pathway side of the printed circuit board. The second shield cover is provided with two pluralities of securement protrusions. The first plurality of protrusions extends through apertures in the printed circuit board to electrically and mechanically engage the body of the shield. The second plurality of protrusions electrically and mechanically engage respective support projections of the shield. In this way, a more complete shield assembly is accomplished.

BRIEF DESCRIPTION OF THE DRAWINGS

Reference can be made to the drawings wherein.

DETAILED DESCRIPTION OF THE PREFERRED EMBODIMENT

Figure 1:
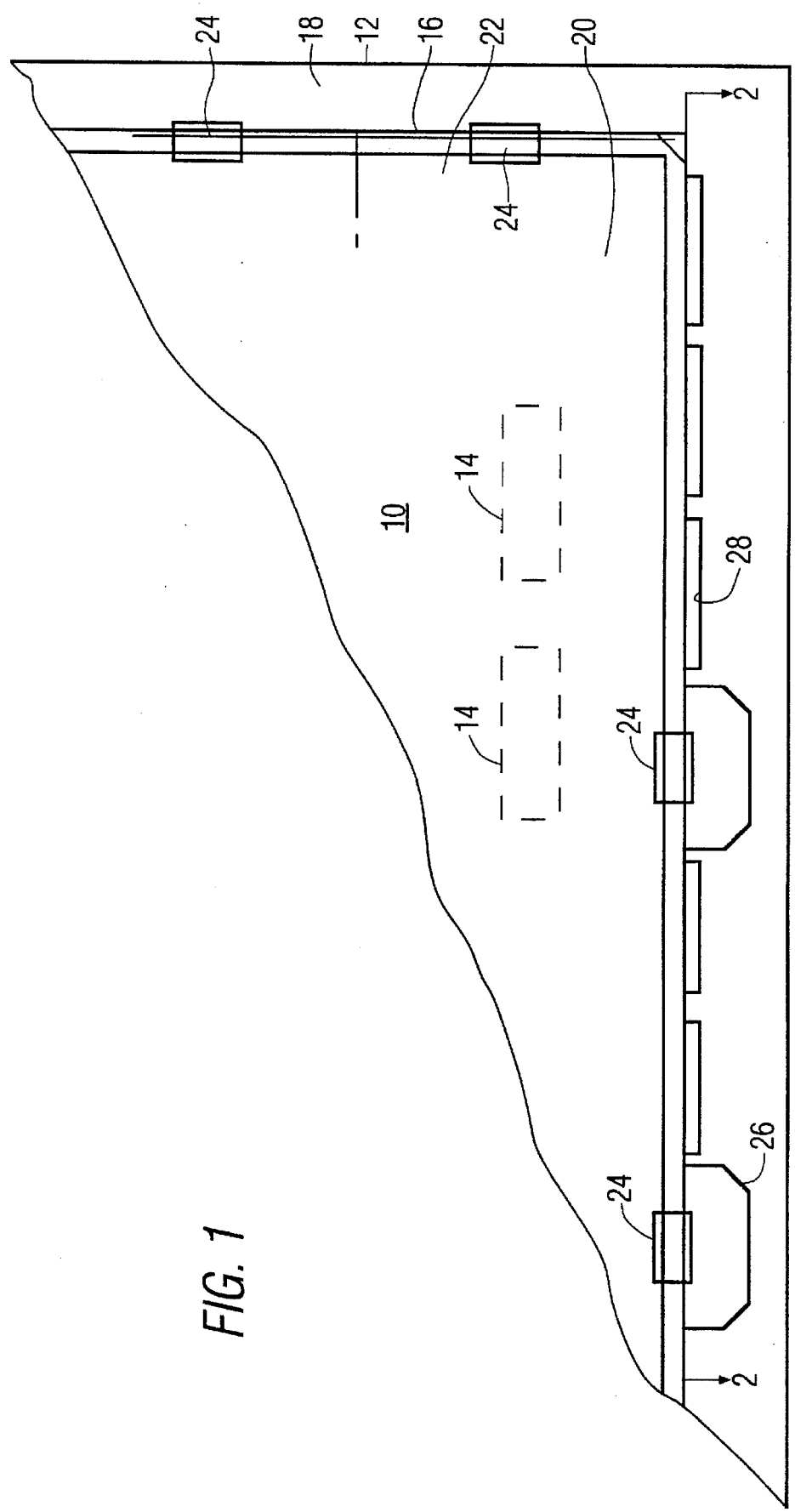
FIG. 1 shows a partial top cutaway view of the shield of the present invention mounted onto a printed circuit board.

Referring now to the drawings wherein like members are given like numerical designation, there is shown in the Figures an RF shielding arrangement according to aspects of the present invention.

FIG. 1 shows a partial top view of an electromagnetic shield assembly, generally designated 10, mounted on a printed circuit board 12. Printed circuit board 12 contains other circuitry including circuit components 14 which are enclosed by shield assembly 10. Circuit components 14 can be any kind of electronic component, e.g., a resistor, an inductor, a capacitor, an integrated circuit, a varactor, a variable resistor, a surface acoustic wave filter, or the like. The specific circuit configuration forms no part of this invention and accordingly, will not be discussed further except as may be needed in order to explain the functioning of the shield.

Shield assembly 10 includes a shield 16 mounted on the component side 18 of printed circuit board 12, and circumposes an area 20 which includes components 14. A top cover 22 electrically and mechanically engages shield 16 along an edge distal of the component side of printed circuit board 12, and is secured by spring fingers 24 to the side of shield 16. Since shield 16 is electrically coupled to a reference potential, typically ground, shield cover 22 is also coupled to electrical ground and electromagnetically shields area 20 in one direction orthogonal to the plane of printed circuit board 12. The exemplary components of shield assembly 10, i.e., shield 16, top cover 22, and bottom cover 34 (see FIG. 2 and discussed more fully below), are made of a solder plated steel material. However, any other suitable material which will shield against electromagnetic fields and which preferably, is solderable, can be used.

Apertures 26 and 28 are provided in printed circuit board 12. Protrusions 30 of shield 16 extend through respective apertures 26 and are soldered to appropriate conductor pads on conductor side 36. Apertures 26 and 28 are also provided for passage therethrough of respective electrically conductive securement protrusions 32 and 42 of bottom cover 34.

Figure 2:
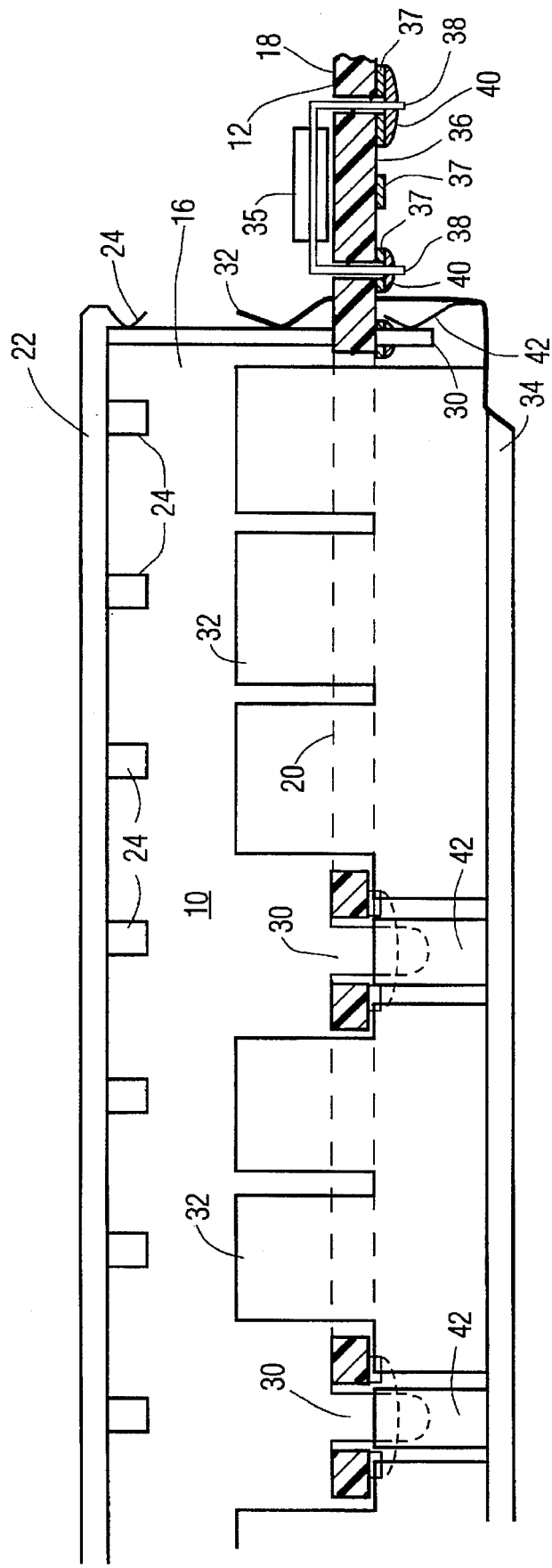
FIG. 2 is an elevational sectional view of FIG. 1 generally taken along line 2—2 according to aspects of the present invention and include a component mounted on the printed circuit board external of the shield.

FIG. 2 shows a partial cutaway elevational view generally along line 2—2 of FIG. 1 with an additional component 35 mounted on component mounting side 18 external of the shielded area 20. Component 35 has leads 38 extending through apertures in the board to conductor side 36 having electrically conductive pathways 37 thereon. Leads 38 are soldered to appropriate portions of pathway 37 by solder fillets 40. Shielded components 14 are mechanically and electrically mounted in a similar manner.

Bottom cover 34 is disposed proximal the conductor side 36 of printed circuit board 12, and electromagnetically shields area 20 in the same manner as top shield 22 except on the other side of printed circuit board 12. Bottom cover 34 is provided with a first plurality of protrusions 32 which extend through respective apertures 28 in printed circuit board 12 and mechanically and electrically engage the body of shield 12 in a spring loaded manner. According to an aspect of the present invention, bottom cover 34 is also provided with a second plurality of protrusions 42 which mechanically and electrically engage protrusions 30. In this manner, the gaps in the shield assembly are minimized.

I claim:

1. In an electronic device having circuitry components mounted on a printed circuit board and an electromagnetic shield assembly shielding at least a portion of the printed circuit board, apparatus comprising:

a planar printed circuit board having thickness, a component mounting side wherein leads of mounted components are inserted through apertures extending through the thickness of the board, and a conductor side having electrically conductive pathways disposed thereon for providing predetermined solderable electrical interconnections between the leads of the mounted components, an electromagnetic shielding means mounted on the component mounting side of the printed circuit board and having elongated support members extending through the thickness of the printed circuit board to the conductor side and electrically connected to a reference potential through an electrically conductive pathway, the electromagnetic shielding means having a body portion, and edge proximal the component side of the printed circuit board and an edge distal of the component side of the printed circuit board, said shield enclosing a predetermined area of the printed circuit board, a first electromagnetic shielding cover means extending over the predetermined area of the printed circuit board and removably engaging the edge of the electromagnetic shielding means distal of the component side of the printed circuit board for electromagnetically shielding the predetermined area in cooperation with the electromagnetic shielding means, and a second electromagnetic shielding cover means disposed proximal to the electrically conductive pathway side of the printed circuit board and extending over the predetermined area, the second electromagnetic shielding cover means having a first and a second separate pluralities of members, the first plurality of members extending through apertures in the printed circuit board for engaging the body of the electromagnetic shielding means, the second plurality of members engaging the support members of the electromagnetic shielding means, the second electromagnetic shield cover means electromagnetically shielding the predetermined area in cooperation with the electromagnetic shield means.

2. The apparatus of claim 1 wherein the apparatus is a tuner of a television receiver.

3. The apparatus of claim 1 wherein the apparatus is a tuner of a television receiver for receiving direct satellite broadcasts.

4. The apparatus of claim 1 wherein the apparatus is a tuner of a FM radio receiver.

5. The apparatus of claim 1 wherein the apparatus is an audio amplifier.

6. The apparatus of claim 1 wherein the first plurality of members of the second electromagnetic shielding cover means removably engage the electromagnetic shielding means, and the second plurality of members of the second electromagnetic shielding cover means removably engage the support members of the electromagnetic shielding means.

7. An RF shield for a printed circuit board comprising:

an electromagnetic shielding means for mounting onto a first side a printed circuit board and having a body, a first edge disposed distal of the printed circuit board and a second edge disposed proximal the printed circuit board, the shielding means having elongated support members at the second edge extending through apertures in the printed circuit board, and electrically contacted to an electrically conductive pathway disposed on a second side of the printed circuit board, a first electromagnetic shielding cover means for engaging the first edge of the electromagnetic shielding means, and a second electromagnetic shielding cover means proximal to the second side of the printed circuit board, the second electromagnetic shielding cover means having two separate pluralities of members, the first plurality of members extending through apertures of the printed circuit board for engaging the body of the electromagnetic shielding means, and the second plurality of members engaging the support members of the electromagnetic shielding means.

* * * * *